US012755938B2

(12) United States Patent
Ikeda et al.

(10) Patent No.: US 12,755,938 B2
(45) Date of Patent: Oct. 6, 2026

(54) FILTER CIRCUIT AND PLASMA PROCESSING APPARATUS

(71) Applicant: Tokyo Electron Limited, Tokyo (JP)

(72) Inventors: Taro Ikeda, Nirasaki City (JP); Shuto Watanabe, Nirasaki City (JP); Yuki Osada, Nirasaki City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 27 days.

(21) Appl. No.: 19/061,185

(22) Filed: Feb. 24, 2025

(65) Prior Publication Data

US 2025/0285838 A1 Sep. 11, 2025

(30) Foreign Application Priority Data

Mar. 5, 2024 (JP) ................................ 2024-033211

(51) Int. Cl.
*H01J 37/32* (2006.01)

(52) U.S. Cl.
CPC ..... *H01J 37/32174* (2013.01); *H01J 37/3211* (2013.01); *H01J 2237/334* (2013.01)

(58) Field of Classification Search
CPC ............. H01J 37/3222; H01J 37/32192; H01J 37/3211; H01J 37/32174; H01J 37/32238; H01J 37/32256; H01J 37/32266; H01J 37/32293; H01J 2237/327; H01J 2237/334
See application file for complete search history.

(56) References Cited

U.S. PATENT DOCUMENTS

2020/0295423 A1* 9/2020 Li ............................ H01P 7/04
2024/0047178 A1* 2/2024 Briglin .................. G01N 21/73
2025/0239753 A1* 7/2025 Fukui ....................... H01P 3/12

FOREIGN PATENT DOCUMENTS

JP 2014-99585 A 5/2014

* cited by examiner

*Primary Examiner* — Wei (Victor) Y Chan
(74) *Attorney, Agent, or Firm* — Nath, Goldberg & Meyer; Jerald L. Meyer; Tanya E. Harkins

(57) ABSTRACT

A filter circuit, includes: a housing made of a conductor and including an input port and an output port, formed with outer and inner conductors, wherein the housing is at ground potential with the outer conductors and includes an internal space having an area extending in first and second directions orthogonal to each other in a plane view; a partition portion made of a conductor and connected to the housing to partition the internal space; and a power feed line that is provided within the housing while insulated from the housing and includes input-side and output-side conductors, which are the inner conductors of the input and output ports, an antenna portion connected to the input-side and output-side conductors and extending in the internal space to be stacked with the partition portion, and an antenna base connecting the input-side and output-side conductors and the antenna portion.

17 Claims, 12 Drawing Sheets

FIG. 12

96

| | | Contact Surface | | | |
|---|---|---|---|---|---|
| | | 60c+60d | 60c | 60d | Non-contact |
| Contact Surface | 60a+60b | ○ | × | × | × |
| | 60a | ○ (δ ≦2mm) | × | × | × |
| | 60b | ○ (δ ≦2mm) | × | × | × |
| | Non-contact | × | × | × | × |

FILTER CIRCUIT AND PLASMA PROCESSING APPARATUS

CROSS-REFERENCE TO RELATED APPLICATION

This application is based upon and claims the benefit of priority from Japanese Patent Application No. 2024-033211, filed on Mar. 5, 2024, the entire contents of which are incorporated herein by reference.

TECHNICAL FIELD

This disclosure relates to a filter circuit and a plasma processing apparatus.

BACKGROUND

A plasma processing apparatus disclosed in Patent Document 1 includes a processing container in which a plasma process is performed, a stage disposed on a plate-shaped conductive base with a space disposed therebetween within the processing container to hold a substrate, a radio-frequency electrode provided in the stage, a radio-frequency power feeder for applying a radio-frequency of a certain frequency to the radio-frequency electrode, a heating element provided in the stage, a heater power feed line for electrically connecting the heating element to a heater power supply disposed at an outside of the processing container, a coil for attenuating or blocking radio-frequency noise introduced into the heater power feed line via the heating element, and filter unit including a casing for accommodating the coil.

PRIOR ART DOCUMENTS

Patent Documents

Patent Document 1: Japanese Patent Laid-Open Publication No. 2014-99585

SUMMARY

According to one embodiment of the present disclosure, a filter circuit, includes: a housing made of a conductor and including an input port and an output port, each of the input port and the output port formed with an outer conductor and an inner conductor, wherein the housing is at ground potential together with the outer conductor of the input port and the outer conductor of the output port and is configured such that an internal space, in a plane view, has an area that extends in a first direction and in a second direction orthogonal to the first direction; a partition portion made of a conductor and connected to the housing to partition the internal space; and a power feed line provided within the housing and insulated from the housing, wherein the power feed line includes: an input-side conductor, which is the inner conductor of the input port; an output-side conductor, which is the inner conductor of the output port; an antenna portion connected to the input-side conductor and the output-side conductor and extending in the internal space so as to be stacked with the partition portion; and an antenna base configured to connect the input-side conductor, the output-side conductor, and the antenna portion, and wherein the internal space has a dimension in the second direction from the antenna base and a dimension in the first direction from the antenna base larger than the dimension in the second direction from the antenna base.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 12 is a diagram showing an example of changes in filter characteristics in contact patterns between side surfaces of the housing and a partition portion according to the present embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinbelow, an embodiment of a filter circuit and a plasma processing apparatus is described in detail based on the drawings. Technology disclosed herein is not limited to the following embodiment.

In a plasma processing apparatus, a power supply located outside a processing container is connected to an electrostatic chuck or a heater provided in a substrate support that supports a substrate to be processed. Since the substrate support constitutes a lower electrode for generating plasma, a radio frequency for plasma generation may affect a power feed line to the electrostatic chuck or the heater. Therefore, a radio-frequency filter including a coil and a capacitor is inserted into the power feed line. However, the radio-frequency filter including the coil and the capacitor increases structural complexity and size thereof. Therefore, when the radio-frequency filter is installed in a longitudinal direction of the power feed line, achieving a simple and compact radio-frequency filter by shortening a dimension in a width direction is expected.

[Configuration of Plasma Processing System]

Figure 1:
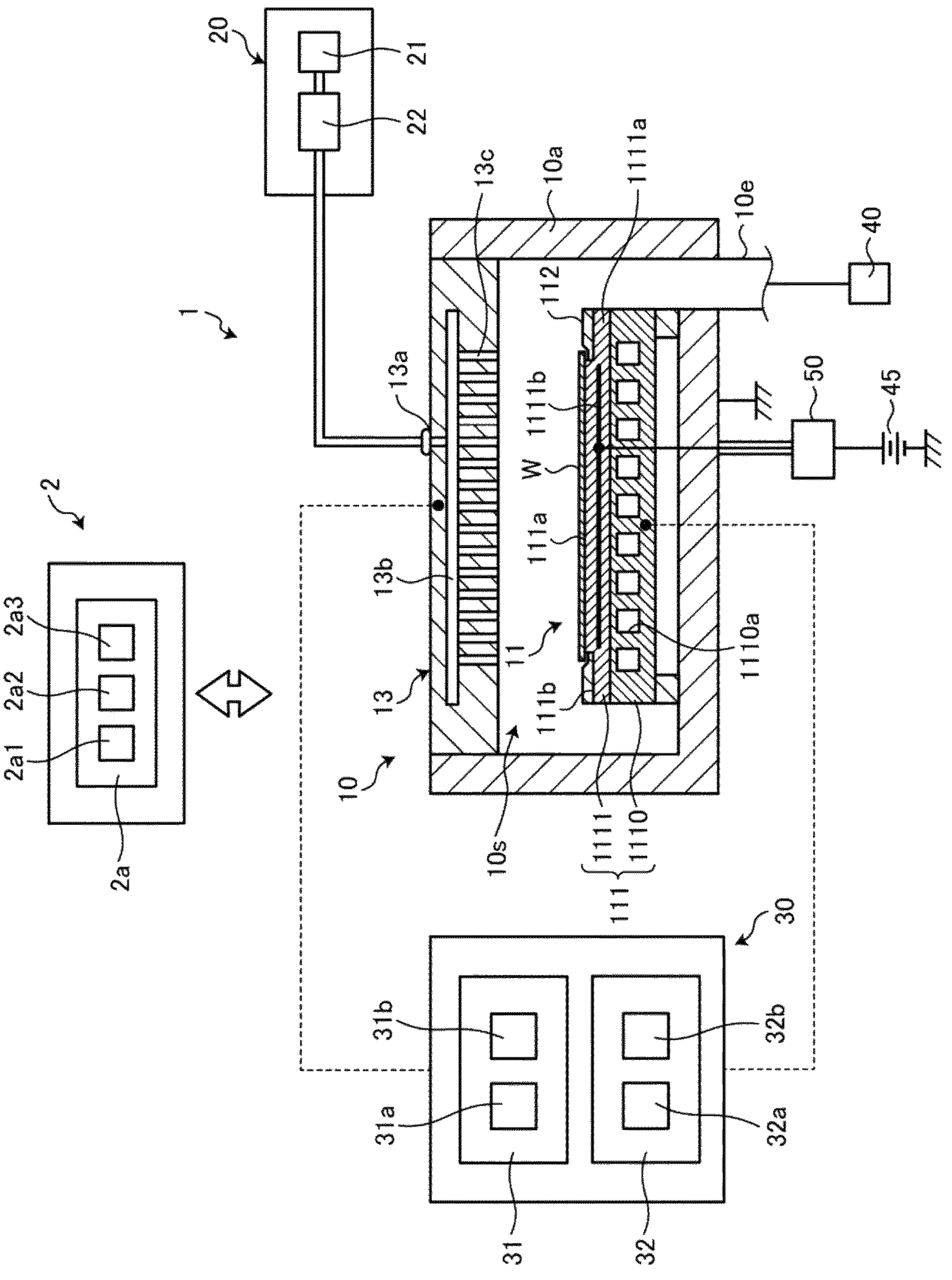
FIG. 1 is a schematic cross-sectional view showing an example of a configuration of a plasma processing apparatus according to an embodiment of the present disclosure.

Hereinafter, an example of a configuration of a plasma processing system is described. FIG. 1 is a schematic cross-sectional view showing an example of a configuration of a plasma processing apparatus according to an embodiment of the present disclosure. As shown in FIG. 1, the plasma processing system includes a capacitively coupled plasma processing apparatus 1 and a controller 2. The capacitively coupled plasma processing apparatus 1 includes a plasma processing chamber 10, a gas supplier 20, a power supply 30, an exhaust system 40, a direct current (DC) power supply 45, and a filter circuit 50. The plasma processing apparatus 1 also includes a substrate support 11 and a gas introducer. The gas introducer is configured to introduce at least one process gas into the plasma processing chamber 10. The gas introducer includes a shower head 13. The substrate support 11 is disposed within the plasma processing chamber 10. The shower head 13 is disposed above the substrate support 11. In one embodiment, the shower head 13 constitutes at least a part of a ceiling of the plasma processing chamber 10. The plasma processing chamber 10 includes a plasma processing space 10*s* defined by the shower head 13, a sidewall 10*a* of the plasma processing chamber 10, and the substrate support 11. The plasma processing chamber 10 includes at least one gas supply port for supplying at least one process gas to the plasma processing space 10*s* and at least one gas discharge port for discharging gas from the plasma processing space 10*s*. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 includes a central region 111*a* for supporting a substrate W and an annular region 111*b* for supporting the ring assembly 112. A wafer is an example of the substrate W. The annular region 111*b* of the main body 111 surrounds the central region 111*a* of the main body 111 in a plane view. The substrate W is disposed on the central region 111*a* of the main body 111, and the ring assembly 112 is disposed on the annular region 111*b* of the main body 111 so as to surround the substrate W on the central region 111*a* of the main body 111. Therefore, the central region 111*a* is also called a substrate support surface for supporting the substrate W, and the annular region 111*b* is also called a ring support surface for supporting the ring assembly 112.

In one embodiment, the main body 111 includes a base 1110 and an electrostatic chuck 1111. The base 1110 includes a conductive member. The conductive member of the base 1110 may serve as a lower electrode. The electrostatic chuck 1111 is disposed on the base 1110. The electrostatic chuck 1111 includes a ceramic member 1111*a* and an electrostatic electrode 1111*b* disposed within the ceramic member 1111*a*. The ceramic member 1111*a* includes the central region 111*a*. In one embodiment, the ceramic member 1111*a* also includes the annular region 111*b*. Another member surrounding the electrostatic chuck 1111, such as an annular electrostatic chuck or an annular insulating member, may include the annular region 111*b*. In this case, the ring assembly 112 may be disposed on the annular electrostatic chuck or the annular insulating member or may be disposed on both the electrostatic chuck 1111 and the annular insulating member. The electrostatic electrode 1111*b* is connected to the DC power supply 45 through the filter circuit 50. When a voltage from the DC power supply 45 is applied to the electrostatic electrode 1111*b*, electrostatic attractive force occurs between the electrostatic chuck 1111 and the substrate W. The substrate W is attracted to the electrostatic chuck 1111 by the electrostatic attractive force that has occurred and is held by the electrostatic chuck 1111.

In addition, at least one radio frequency (RF)/DC electrode coupled to an RF power supply 31 and/or a DC power supply 32 described later may be disposed within the ceramic member 1111*a*. In this case, the at least one RF/DC electrode functions as a lower electrode. When a bias RF signal and/or a DC signal described later is supplied to the at least one RF/DC electrode, the RF/DC electrode is also called a bias electrode. In addition, the conductive member of the base 1110 and the at least one RF/DC electrode may function as a plurality of lower electrodes. Furthermore, the electrostatic electrode 1111*b* may function as the lower electrode. Therefore, the substrate support 11 includes at least one lower electrode.

The substrate support 11 may include a temperature adjustment module configured to adjust at least one selected from the group of the electrostatic chuck 1111, the ring assembly 112, or the substrate W to a target temperature. The temperature adjustment module may include a heater, a heat transfer medium, a flow passage 1110*a*, or a combination thereof. A heat transfer fluid such as brine or gas flows through the flow passage 1110*a*. In one embodiment, the flow passage 1110*a* is formed within the base 1110, and one or plural heaters are disposed within the ceramic member 1111*a* of the electrostatic chuck 1111. The substrate support 11 may include a heat transfer gas supplier configured to supply a heat transfer gas to a gap between a back surface of the substrate W and the central region 111*a*.

The shower head 13 is configured to introduce at least one process gas from the gas supplier 20 into the plasma processing space 10*s*. The shower head 13 includes at least one gas supply port 13*a*, at least one gas diffusion chamber 13*b*, and a plurality of gas introduction ports 13*c*. The process gas supplied to the gas supply port 13*a* passes through the gas diffusion chamber 13*b* and is introduced into the plasma processing space 10*s* from the gas introduction ports 13*c*. The shower head 13 also includes at least one upper electrode. The gas introducer may include, in addition to the shower head 13, one or plural side gas injectors (SGIs) installed in one or plural openings formed at the sidewall 10*a*.

The gas supplier 20 may include at least one gas source 21 and at least one flow rate controller 22. In one embodiment, the gas supplier 20 is configured to supply at least one process gas to the shower head 13 from each corresponding gas source 21 through each corresponding flow rate controller 22. Each flow rate controller 22 may include, for example, a mass flow controller or a pressure-controlled flow rate controller. In addition, the gas supplier 20 may include one or more flow rate modulation devices that modulate or pulse a flow rate of the at least one process gas.

The power supply 30 includes the RF power supply 31 coupled to the plasma processing chamber 10 via at least one impedance matching circuit. The RF power supply 31 is configured to supply at least one RF signal (RF power) to at least one lower electrode and/or at least one upper electrode. Thereby, plasma is formed from the at least one process gas supplied to the plasma processing space 10*s*. Therefore, the RF power supply 31 may function as at least a part of a plasma generator configured to generate plasma from one or more process gases in the plasma processing chamber 10. Additionally, by supplying a bias RF signal to the at least one lower electrode, a bias potential may be generated on the substrate W, thereby drawing ion components in the formed plasma to the substrate W.

In one embodiment, the RF power supply 31 includes a first RF generator 31*a* and a second RF generator 31*b*. The first RF generator 31*a* is configured to be coupled to the at least one lower electrode and/or the at least one upper electrode through the at least one impedance matching circuit and generate a source RF signal (source RF power) for plasma generation. In one embodiment, the source RF signal has a frequency in a range of 10 MHz to 300 MHZ. In one embodiment, the first RF generator 31*a* may be configured to generate a plurality of source RF signals having different frequencies. The generated one or more source RF signals are supplied to the at least one lower electrode and/or the at least one upper electrode.

The second RF generator 31*b* is configured to be coupled to the at least one lower electrode through the at least one impedance matching circuit and generate a bias RF signal (bias RF power). A frequency of the bias RF signal may be the same as or different from the frequency of the source RF signal. In one embodiment, the bias RF signal has a frequency lower than the frequency of the source RF signal. In one embodiment, the bias RF signal has a frequency in a range of 100 kHz to 60 MHz. In one embodiment, the second RF generator 31*b* may be configured to generate a plurality of bias RF signals having different frequencies. The generated one or more bias RF signals are supplied to the at least one lower electrode. In various embodiments, at least one selected from the group of the source RF signal and the bias RF signal may be pulsed.

In addition, the power supply 30 may include the DC power supply 32 coupled to the plasma processing chamber 10. The DC power supply 32 includes a first DC generator 32*a* and a second DC generator 32*b*. In one embodiment, the first DC generator 32*a* is configured to be connected to the at least one lower electrode and generate a first DC signal. The generated first DC signal (bias DC signal) is applied to the at least one lower electrode. In one embodiment, the second DC generator 32*b* is configured to be connected to the at least one upper electrode and generate a second DC signal. The generated second DC signal is applied to the at least one upper electrode.

In various embodiments, at least one selected from the group of the first DC signal and the second DC signal may be pulsed. In this case, a sequence of voltage pulses is applied to the at least one lower electrode and/or the at least one upper electrode. The voltage pulses may have rectangular, trapezoidal, or triangular pulse waveforms, or combinations thereof. In one embodiment, a waveform generator for generating the sequence of the voltage pulses from the DC signal is connected between the first DC generator 32*a* and the at least one lower electrode. Accordingly, the first DC generator 32*a* and the waveform generator constitute a voltage pulse generator. When the second DC generator 32*b* and the waveform generator constitute the voltage pulse generator, the voltage pulse generator is connected to the at least one upper electrode. The voltage pulses may have positive polarity or negative polarity. Further, the sequence of the voltage pulses may include one or plural positive voltage pulses or one or plural negative voltage pulses within one cycle. The first and second DC generators 32*a* and 32*b* may be provided in addition to the RF power supply 31, or the first DC generator 32*a* may be provided instead of the second RF generator 31*b*.

The exhaust system 40 may be connected, for example, to a gas discharge port 10*e* provided at a bottom of the plasma processing chamber 10. The exhaust system 40 may include a pressure regulating valve and a vacuum pump. A pressure inside the plasma processing space 10*s* is regulated by the pressure regulating valve. The vacuum pump may include a turbomolecular pump, a dry pump, or a combination thereof.

The filter circuit 50 removes influence of a radio-frequency power for plasma generation or bias on the DC power supply 45 when plasma is generated in the plasma processing space 10*s*. The filter circuit 50 passes DC applied from the DC power supply 45 to the electrostatic electrode 1111*b* and blocks the radio-frequency power flowing in a reverse direction from the electrostatic electrode 1111*b*. In other words, the filter circuit 50 is provided on a power feed line (first power feed line) that feeds a power to an electrode exposed to an electromagnetic wave for generating plasma within the plasma processing chamber 10.

The controller 2 processes a computer-executable instruction that allows the plasma processing apparatus 1 to execute various processes described in the present disclosure. The controller 2 may be configured to control each element of the plasma processing apparatus 1 to execute various processes described herein. In one embodiment, a part or all of the controller 2 may be included in the plasma processing apparatus 1. The controller 2 may include a processor 2*a*1, a storage 2*a*2, and a communication interface 2*a*3. The controller 2 is achieved by, for example, a computer 2*a*. The processor 2*al* may be configured to perform various control operations by reading a program from the storage 2*a*2 and executing the read program. This program may be stored in the storage 2*a*2 in advance or may be acquired from a medium when necessary. The acquired program is stored in the storage 2*a*2 and is read from the storage 2*a*2 and executed by the processor 2*a*1. The medium may be various storage media readable by the computer 2*a* or may be a communication line connected to the communication interface 2*a*3. The processor 2*al* may be a central processing unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via the communication line such as a local area network (LAN).

[Structure of Filter Circuit 50]

Figure 2:
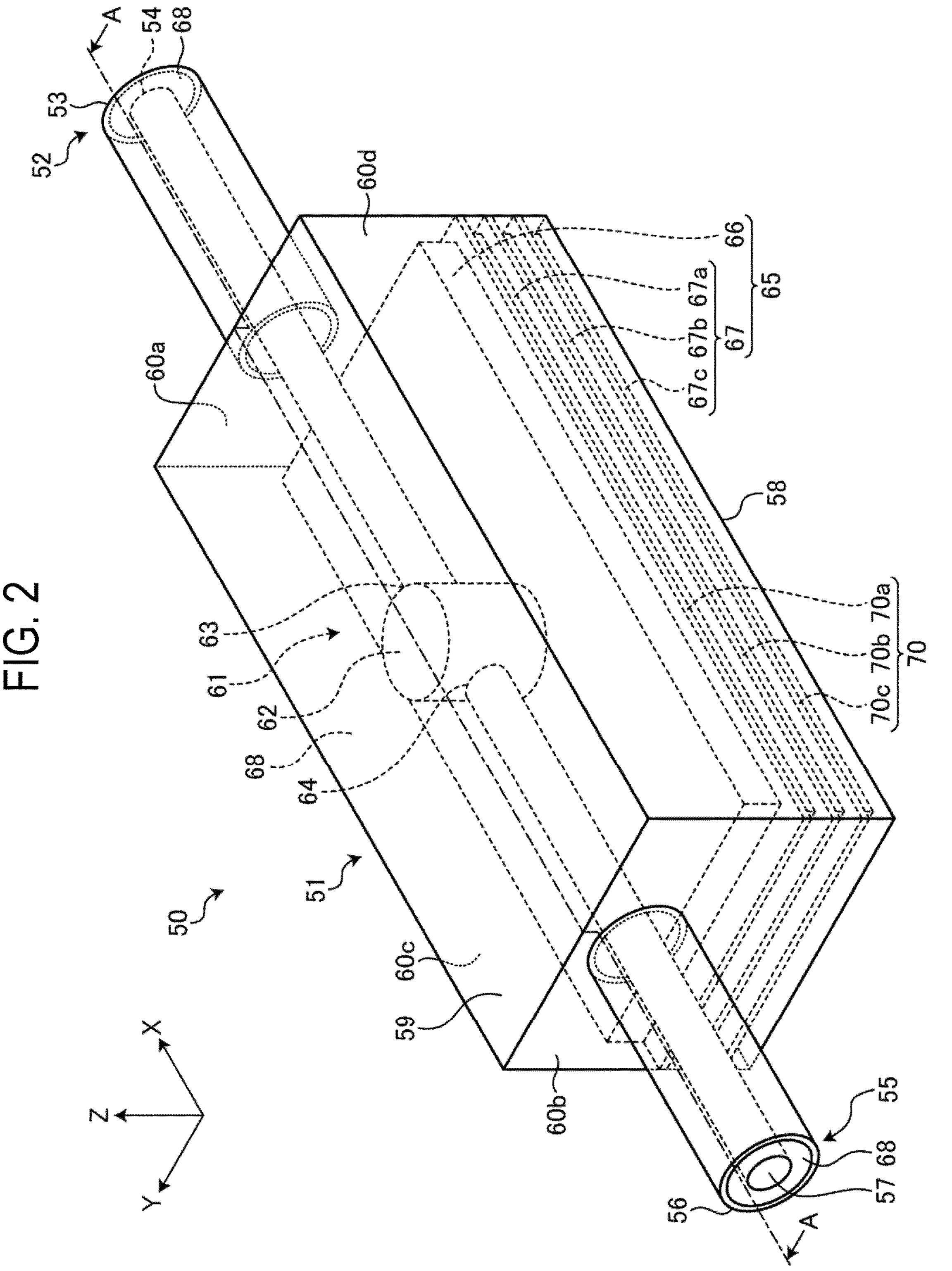
FIG. 2 is a perspective view showing an example of a filter circuit according to the present embodiment.
Figure 3:
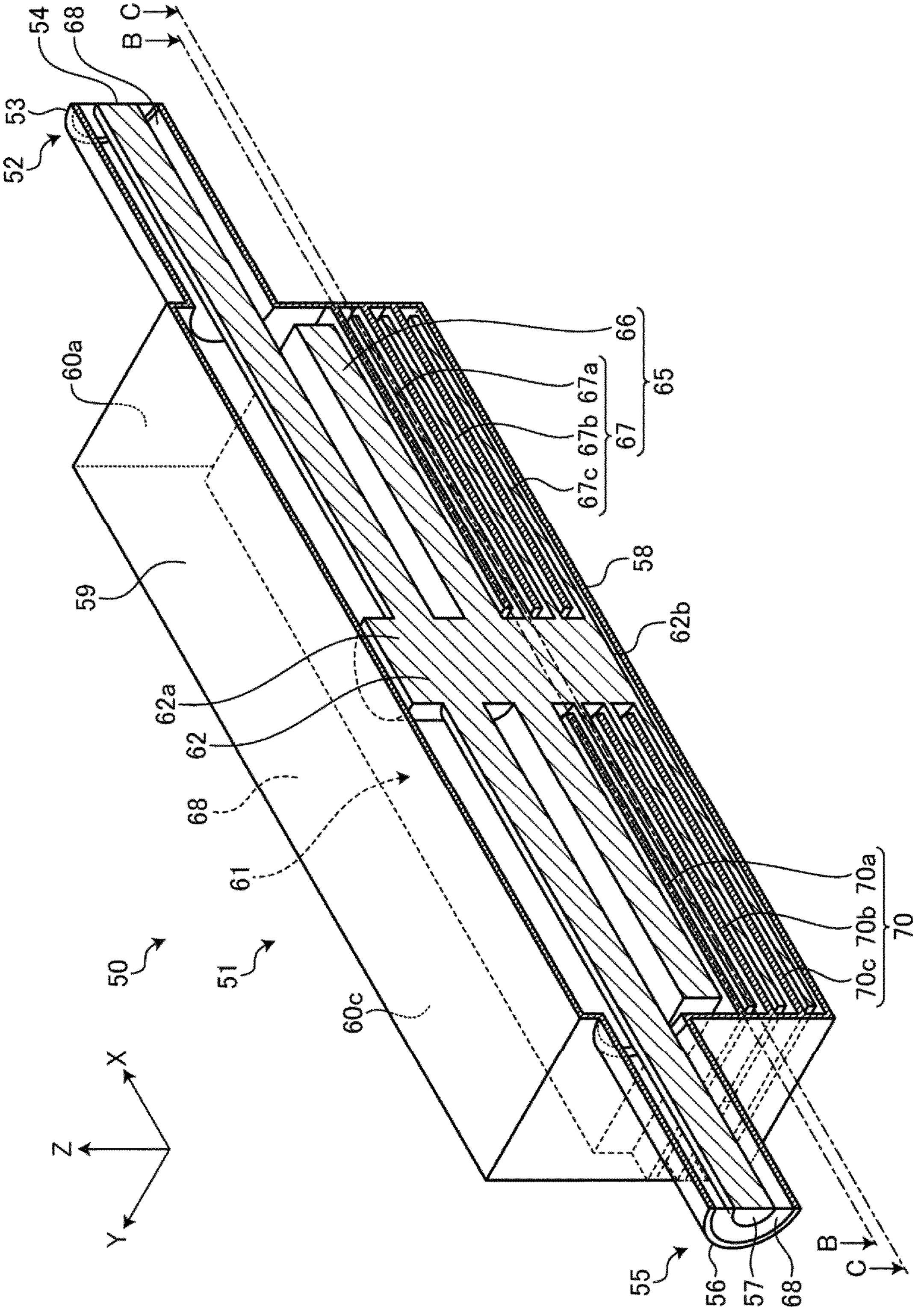
FIG. 3 is a cross-sectional view showing an example of a cross-section taken along line A-A in FIG. 2.
Figure 4:
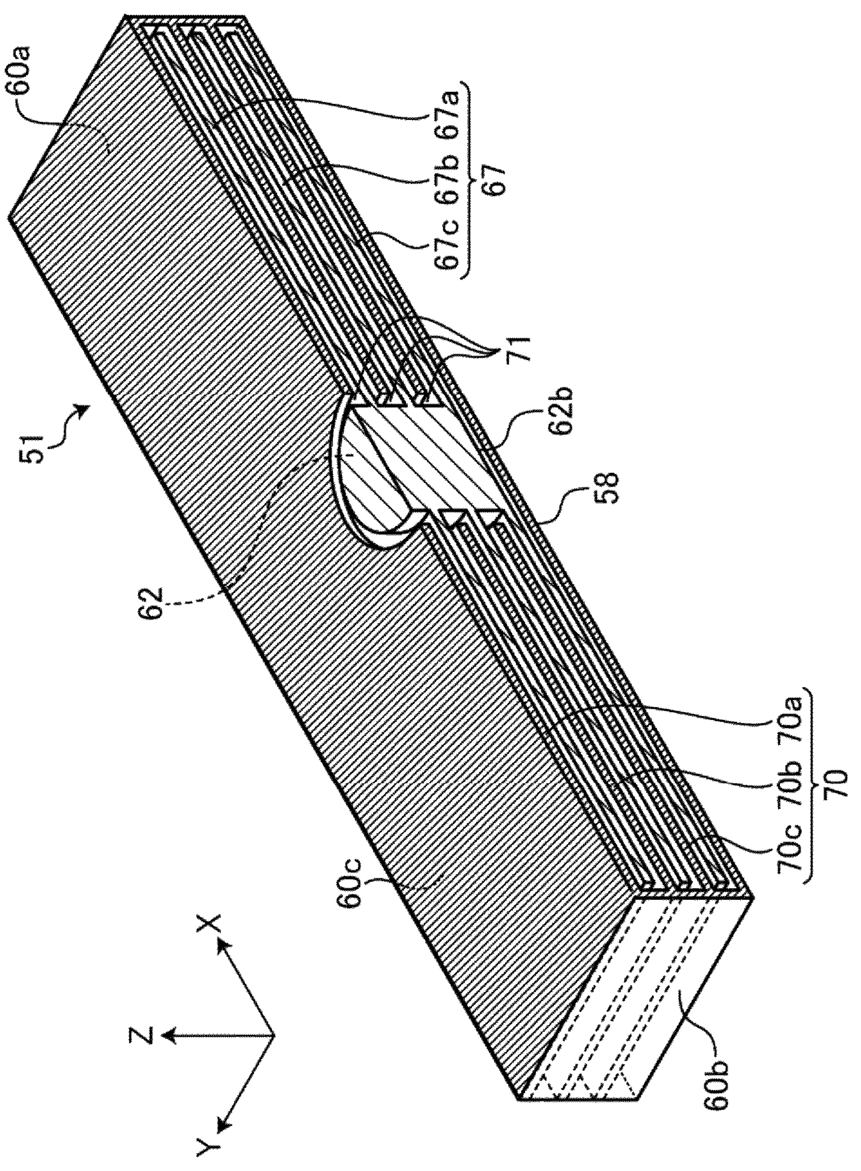
FIG. 4 is a cross-sectional view showing an example of a cross-section taken along line B-B in FIG. 3.
Figure 5:
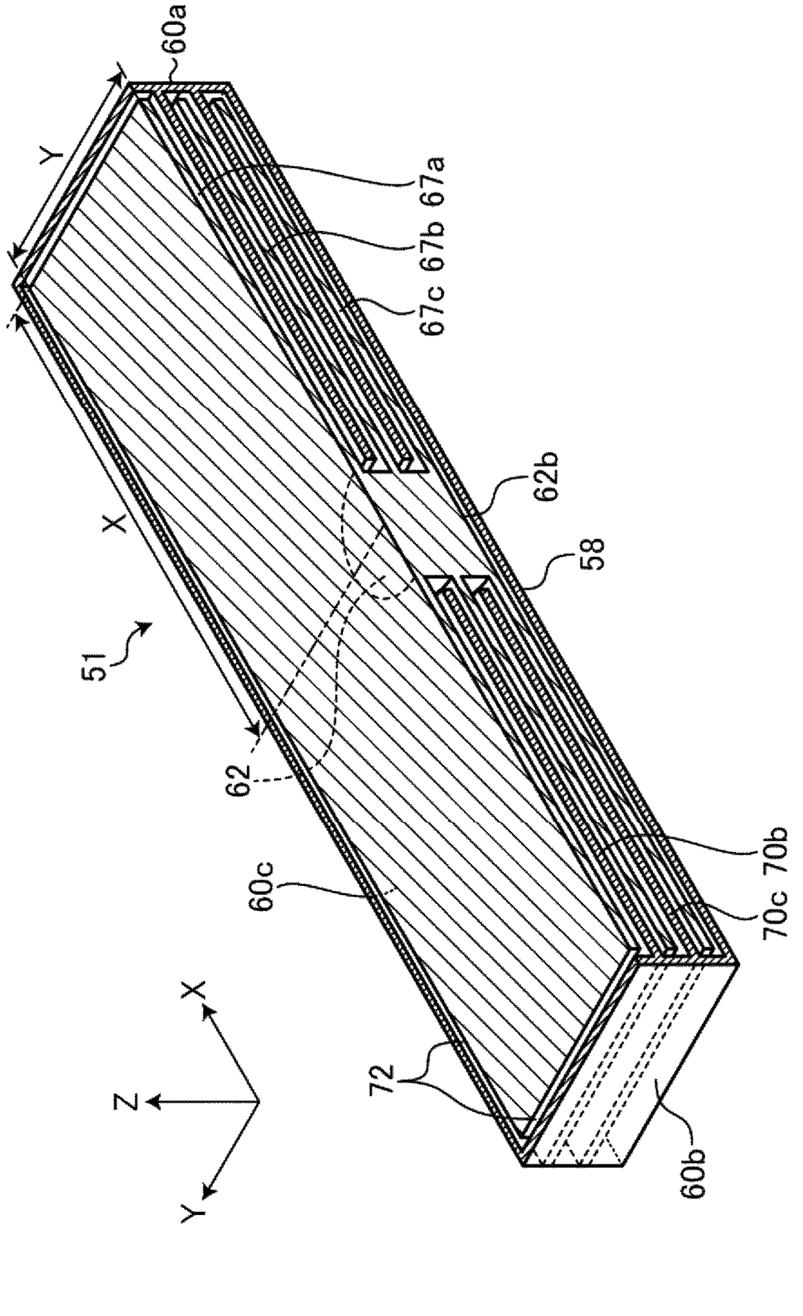
FIG. 5 is a cross-sectional view showing an example of a cross-section taken along line C-C in FIG. 3.

Next, the filter circuit 50 is described in detail with reference to FIGS. 2 to 5. FIG. 2 is a perspective view showing an example of a filter circuit according to the present embodiment. FIG. 3 is a cross-sectional view showing an example of a cross-section taken along line A-A in FIG. 2. The following description is given by referring to a longitudinal direction of the filter circuit 50 as an X direction along an X axis and a short direction of the filter circuit 50 as a Y direction along a Y axis. In addition, a direction along a Z axis orthogonal to the X axis and the Y axis is referred to as a Z direction. The X direction is an example of a first direction, the Y direction is an example of a second direction, and the Z direction is an example of a third direction. Cross-sections shown in FIGS. 3 to 5 illustrate that air is used as a dielectric 68 described later. As shown in FIGS. 2 and 3, the filter circuit 50 includes a housing 51. The housing 51 is made of a conductor such as aluminum or copper. In addition, the housing 51 includes an input port 52 and an output port 55. In the present embodiment, since the radio-frequency power is blocked, a side connected to the electrostatic electrode 1111*b* is referred to as the input port 52 and a side connected to the DC power supply 45 is referred to as the output port 55, based on a flow direction of the radio-frequency power. The input port 52 and the output port 55 may be interchangeably connected.

The input port 52 and the output port 55 are formed of outer conductors 53 and 56 and inner conductors 54 and 57, respectively. In other words, the input port 52 and the output port 55 are formed in a coaxial structure. The housing 51 is conductively connected to the outer conductors 53 and 56 and is at ground potential together with the grounded plasma processing chamber 10, via a coaxial cable connected to the input port 52 or a frame in which the filter circuit 50 is installed. That is, the housing 51 is made of a conductor, includes the input port 52 and the output port 55 formed of the outer conductors 53 and 56 and the inner conductors 54 and 57, respectively, and is at ground potential together with the outer conductors 53 and 56 of the input port 52 and the output port 55. The housing 51 has, for example, a rectangular parallelepiped shape and includes a lower surface 58 and an upper surface 59 intersecting with the Z direction of the rectangular parallelepiped, side surfaces 60*a* and 60*b* intersecting with the X direction, and side surfaces 60*c* and 60*d* intersecting with the Y direction. In other words, the housing 51 is configured such that an internal space has an area in the X direction and the Y direction in a plane view (viewed in the Z direction). An edge portion of the internal space in the X and Y directions may have a chamfered, rounded shape. Also, the housing 51 is provided with the input port 52 formed on the side surface 60*a* and the output port 55 formed on the side surface 60*b* opposite to the side surface 60*a*. The inner conductors 54 and 57 of the input port 52 and the output port 55 are respectively connected to side surfaces 63 and 64 of an upper portion 62*a* of an antenna base 62 located approximately at a center of a plane in the X and Y directions in the internal space of the housing 51. In other words, the input port 52 and the output port 55 extend in the X direction that passes through the antenna base 62. In addition, a power feed line 61 insulated from the housing 51 is formed by the inner conductor (input-side conductor) 54 of the input port 52, the inner conductor (output-side conductor) 57 of the output port 55, an antenna portion 65, and the antenna base 62. The power feed line 61 is an example of a second power feed line and constitutes a part of a first power feed line, which is a path for feeding DC from the DC power supply 45 to the electrostatic electrode 1111*b*.

The antenna base 62 connects the inner conductors 54 and 57, which are the input-side conductor and the output-side conductor, respectively, to the antenna portion 65. The antenna base 62 has, for example, a cylindrical shape and extends in the Z direction. The antenna portion 65 is provided at a lower surface 58 side of the inner conductors 54 and 57 in the Z direction and includes a first fin 66 and a second fin 67. The second fin 67 includes, for example, a plurality of second fins 67*a* to 67*c*. The first fin 66 and the second fin 67 are made of conductors such as plate-shaped aluminum or copper and are connected to the antenna base 62 approximately at the center of the plane in the X and Y directions. The first fin 66 is, for example, thicker than each of the second fins 67*a* to 67*c*. The first fin 66 may also have the same thickness as each of the second fins 67*a* to 67*c*. That is, the antenna portion 65 is provided to be widened from the antenna base 62 in the X and Y directions. Also, the antenna portion 65 is not in contact with the four side surfaces 60*a* to 60*d* of the housing 51. That is, the antenna portion 65 is a rectangle that is slightly smaller than the upper surface 59 in a plane view (when viewed in the Z direction).

A partition portion 70 made of a conductor such as aluminum or copper and connected to the housing 51 to partition the internal space of the housing 51 is provided in the internal space of the housing 51. The partition portion 70 includes, for example, a plurality of partition portions 70*a* to 70*c*. The partition portion 70 is made of a conductor such as plate-shaped aluminum or copper and is connected to the side surfaces 60*a* to 60*d*. Also, the partition portion 70 is installed so as to have a predetermined gap (a gap 71 in FIG. 4 described later) in an annular shape with respect to the antenna base 62 of a cylindrical shape. While the partition portion 70 is in contact with the four side surfaces 60*a* to 60*d* of the housing 51, it may be sufficient as long as the partition portion 70 is in contact with at least two side surfaces 60*c* and 60*d* intersecting with the Y direction and one side surface 60*a* or 60*b* intersecting with the X direction among the side surfaces 60*a* to 60*d* of the housing 51. In other words, the partition portion 70 does not need to be in contact with the side surface 60*a* or the side surface 60*b*.

The antenna portion 65 and the partition portion 70 are provided such that the first fin 66, the second fins 67*a* to 67*c*, and the partition portions 70*a* to 70*c* are alternately formed in the cross-section taken along line A-A. In other words, the antenna portion 65 is connected to the inner conductors 54 and 57, which are the input-side conductor and the output-side conductor respectively, and extends into the internal space so as to be stacked with the partition portion 70. That is, the filter circuit 50 is formed as a choke structure in which a transmission path length of spaces between the first fin 66 or the second fins 67*a* to 67*c* and the partition portions 70*a* to 70*c* or the lower surface 58 is based on a length of a ¼ wavelength of a frequency to be blocked. That is, the filter circuit 50 forms the choke structure in which spaces between the antenna portion 65 and the housing 51 or the partition portion 70, from an end of the first fin 66 of the antenna portion 65 in the X direction, closest to the input port 52 and the output port 55, to a center of an end 62*b* of the antenna base 62 to which the second fin 67*c* farthest from the input port 52 and the output port 55 is connected, are based on a length of a ¼ wavelength of an electromagnetic wave to be blocked. In the following description, the frequency to be blocked in the filter circuit 50 is also simply referred to as a filter frequency.

FIG. 4 is a cross-sectional view showing an example of a cross-section taken along line B-B in FIG. 3. FIG. 5 is a cross-sectional view showing an example of a cross-section taken along line C-C in FIG. 3. As shown in FIG. 4, the partition portions 70*a* to 70*c* connected to the housing 51 are installed so as to have the predetermined gap 71 with respect to the antenna base 62. On the other hand, as shown in FIG. 5, the second fins 67*a* to 67*c* connected to the antenna base 62 are installed so as to have a predetermined gap 72 with respect to the side surfaces 60*a* to 60*d* of the housing 51. As shown in FIGS. 2 and 3, like the second fins 67*a* to 67*c*, the first fin 66 is installed so as to have a predetermined gap with respect to the side surfaces 60*a* to 60*d* of the housing 51. Herein, a total propagation length (path length) of the second fins 67*a* to 67*c* in the X direction is desirably $\lambda/4+a$ with respect to a wavelength 2 of the electromagnetic wave. Herein, $\alpha$ is a parameter for fine adjustment. On the other hand, a total propagation length (path length) of the second fins 67*a* to 67*c* in the Y direction may be sufficiently smaller than λ/4 with respect to the wavelength λ of the electromagnetic wave. For example, if the filter frequency is set to 220 MHz, dimensions in FIG. 5 may be X=55 mm and Y=25 mm. That is, outer dimensions of the housing 51 are 110 mm in the X direction and 50 mm in the Y direction.

As shown in FIG. 3, the filter circuit 50 has a dielectric 68 between the housing 51 and the power feed line 61. That is, the dielectric 68 is filled between the inner conductors 54 and 57 and the upper surface 59 or the side surfaces 60*a* to 60*d*, between the inner conductors 54 and 57 and the first fin 66, and between the first fin 66 and the partition portion 70*a*. Similarly, the dielectric 68 is also filled between the second fins 67*a* to 67*c* and the partition portions 70*a* to 70*c*, between the second fin 67*c* and the lower surface 58, and between the side surfaces 60*a* to 60*d* and the first fin 66 or the second fins 67*a* to 67*c*. In addition, when a solid material is used as the dielectric 68, each space between the partition portions 70*a* to 70*c* and the first fin 66 or the second pins 67*a* to 67*c* is configured to have the dielectric 68 having a sheet shape therebetween, so that a state in which the dielectric 68 is easily filled may be formed. Similarly, the dielectric 68 is also filled between the outer conductor 53 and the inner conductor 54 of the input port 52 and between the outer conductor 56 and the inner conductor 57 of the output port 55. The dielectric 68 may be, for example, air, polytetrafluoroethylene (PTFE), etc. That is, the dielectric 68 having a higher relative permittivity than air may be provided between the partition portion 70 and the antenna portion 65.

A total propagation length (path length) of the filter circuit 50 in the X direction is a space from a tip of the first fin 66 to the end 62*b* of the antenna base 62 through spaces between the first fin 66, the second fins 67, and the partition portion 70. This space forms a choke structure based on a length of a ¼ wavelength of the electromagnetic wave to be blocked. The total propagation length (path length) of the filter circuit 50 in the X direction is a transmission path length W1 shown in FIG. 6. The transmission path length W1 may be expressed by Equation (2) below when the parameter α for fine adjustment described above is defined as Equation (1) below.

$$\alpha = 4 \times \lambda_g / 100 \tag{1}$$

$$W1 = \lambda_g / 4 \pm \alpha \tag{2}$$

For example, if a dimension X of the second fin 67 is set to 55 mm as shown in FIG. 5, the transmission path length W1 has a one-way length of 192.5 mm or a round-trip length of 385 mm by having 3.5 round trips of 55 mm for one way. For example, if the frequency of the radio-frequency power, which is the electromagnetic wave to be blocked, is set to 220 MHz and air with a relative permittivity of 1 is used as the dielectric 68, then 2=1.36 m. Therefore, $\lambda g=\lambda/(\sqrt{1})$ =1360 mm, λg/4=340 mm, and α=54.4 mm. In this case, according to Equation (2), the transmission path length W1 is 340±54.4 mm. Meanwhile, when the dimension X is set to 55 mm, the transmission path length W1 is 385 mm, and this satisfies the range defined by Equation (2). When PTFE with a relative permittivity of 2.1 is used as the dielectric 68, dimensions of the first fin 66, the second fin 67, and the stacked partition portion 70 may be reduced.

[Simulation Results]

Figure 6:
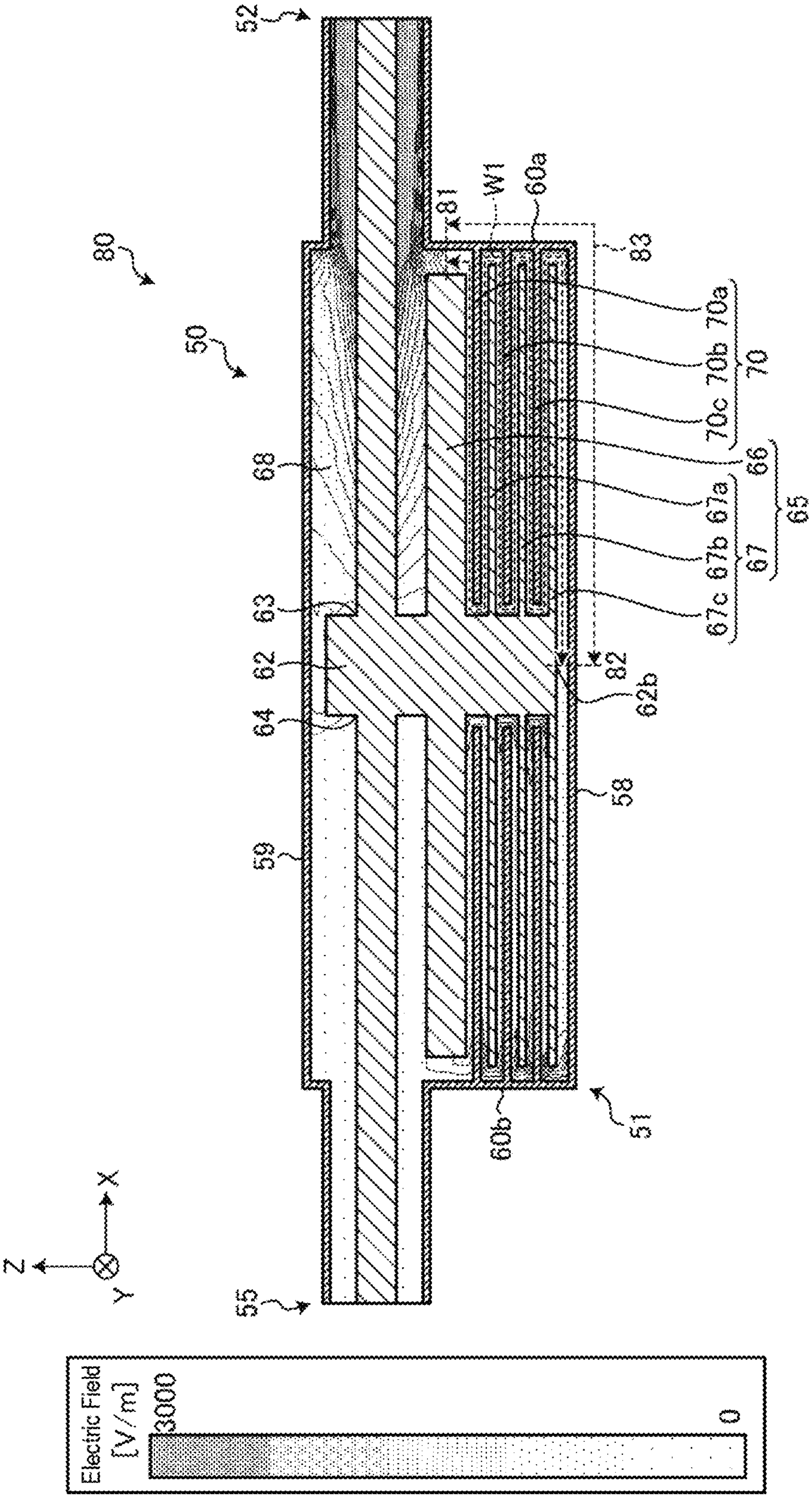
FIG. 6 is a diagram showing an example of a simulation result of an electric field distribution viewed in a cross-section of the filter circuit according to the present embodiment.

Next, simulation results of an electric field distribution of the filter circuit 50 are described with reference to FIGS. 6 and 7. FIG. 6 is a diagram showing an example of a simulation result of an electric field distribution viewed in a cross-section of the filter circuit according to the present embodiment. First, the transmission path length W1 in the cross-section of the filter circuit 50 of FIG. 6 is described. The transmission path length W1 is a path of the dielectric 68 mixed in a section 83 from a position 81 of the tip of the first fin 66 to a position 82 of the end 62*b* of the antenna base 62. In other words, the transmission path length W1 is a path from the position 81 of the tip of the first fin 66 to the position 82 of the end 62*b*, through spaces between the first fin 66 and the partition portion 70*a*, between the partition portion 70*a* and the second fin 67*a*, between the second fin 67*a* and the partition portion 70*b*, between the partition portion 70*b* and the second fin 67*b*, between the second fin 67*b* and the partition portion 70*c*, between the partition portion 70*c* and the second fin 67*c*, and between the second fin 67*c* and the lower surface 58, and via a space which is in contact with a side surface of the antenna base 62 or the side surface 60*a* and connects each of the spaces in the Z direction. While, in FIG. 6, a side of the input port 52 is described, a side of the output port 55 also has the same transmission path length W1. The transmission path length W1 forms a choke structure, called a λ/4 choke, based on the length of a ¼ wavelength of the electromagnetic wave to be blocked. That is, since a part of the electromagnetic wave to be blocked reciprocates along the transmission path length W1, the electromagnetic wave cancels out an electromagnetic wave (travelling wave) directly heading from the side of the input port 52 to the side of the output port 55, thereby preventing output to the side of the output port 55.

A simulation result 80 shown in FIG. 6 illustrates an electric field distribution when a radio-frequency power of 1000 W at a frequency of 220 MHz is input from the input port 52. In the simulation result 80, a space in which the dielectric 68 is present from the side of the input port 52 to the side surface 63 of the antenna base 62 shows a relatively high electric field intensity. Additionally, in the transmission path length W1 of a mixed path from the position 81 to the position 82, spaces between the partition portion 70 and the first fin 66 or the second fin 67 show a relatively high electric field intensity. In a right half of FIG. 6, the electric field distribution is obscured by an arrow of the transmission path length W1. The spaces between the side surface 60*a* and the first fin 66 or the second fin 67 and the spaces between the partition portion 70 and the antenna base 62 show a relatively lower electric field intensity than the spaces between the partition portion 70 and the first fin 66 or the second fin 67. Furthermore, the electric field intensity from the side surface 64 of the antenna base 62 to the side of the output port 55 is nearly zero. In other words, a reflected wave that is shifted by a phase of 180 degrees from a travelling wave is generated by the antenna portion 65 and the partition portion 70 inside the housing 51, and the travelling wave and the reflected wave cancel each other out, such that an output of the radio-frequency power of 220 MHz from the output port 55 becomes 0 W.

Figure 7:
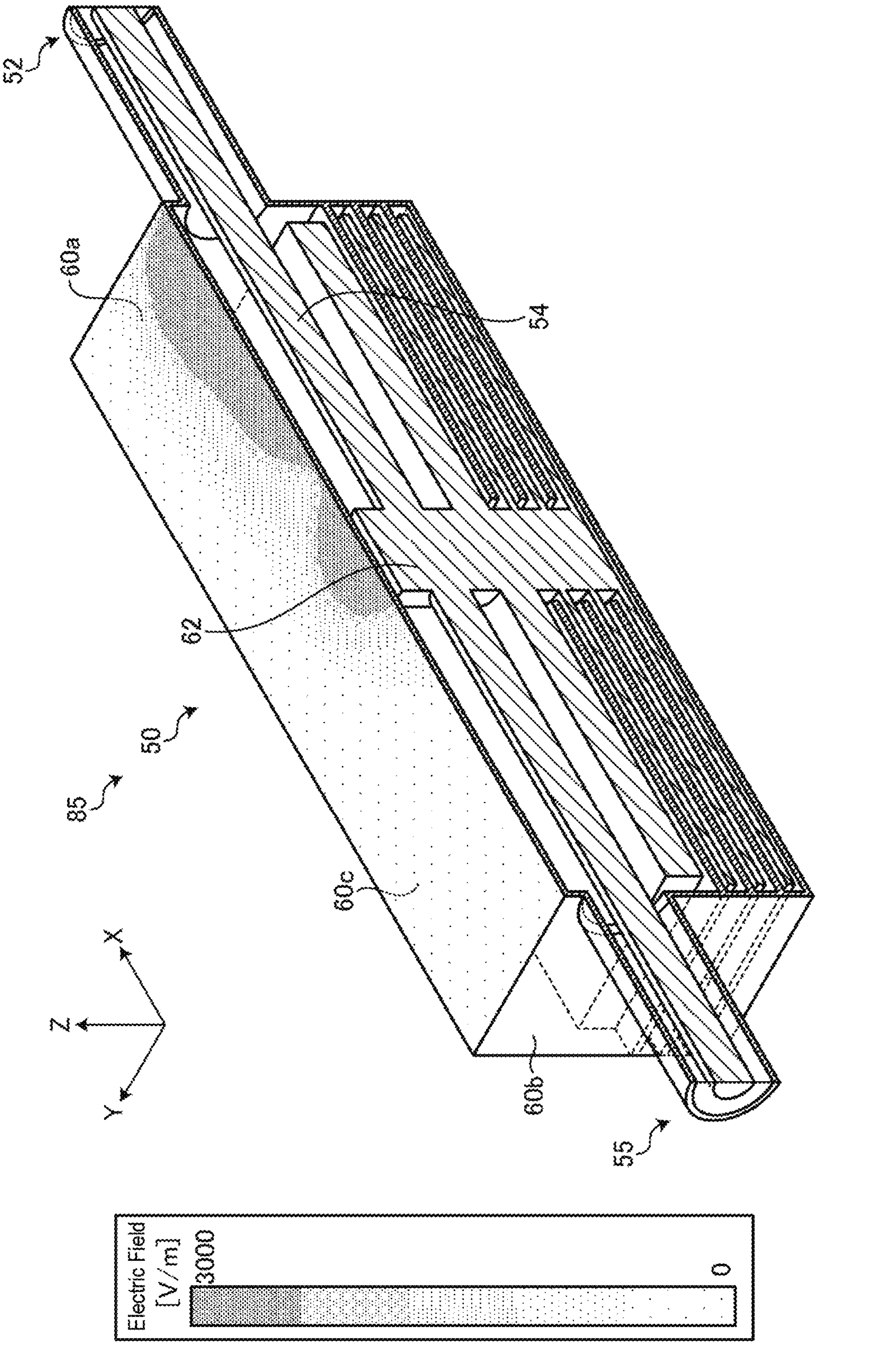
FIG. 7 is a diagram showing an example of a simulation result of an electric field distribution in an XY plane of the filter circuit according to the present embodiment.

FIG. 7 is a diagram showing an example of a simulation result of an electric field distribution in the XY plane of the filter circuit according to the present embodiment. The simulation result 85 shown in FIG. 7, similar to the simulation result 80, illustrates the electric field distribution when the radio-frequency power of 1000 W at the frequency of 220 MHz is input from the input port 52. In the cross-section shown in FIG. 7, a state is shown when air is used as the dielectric 68. In the simulation result 85, the electric field intensity becomes relatively high along the inner conductor 54 from the side of the input port 52 to the antenna base 62. That is, the electric field intensity becomes relatively low near the side surfaces 60*c* and 60*d* in the XY plane, so that it may be appreciated that, even if an edge at each portion (a connection portion of the side surfaces 60*a* and 60*c*) in the XY plane is formed in a round shape, this does not affect the electric field distribution. Additionally, the electromagnetic wave in a space from the input port 52 through the antenna base 62 to the output port 55 may be considered to be a transverse electric (TE) wave.

Figure 8:
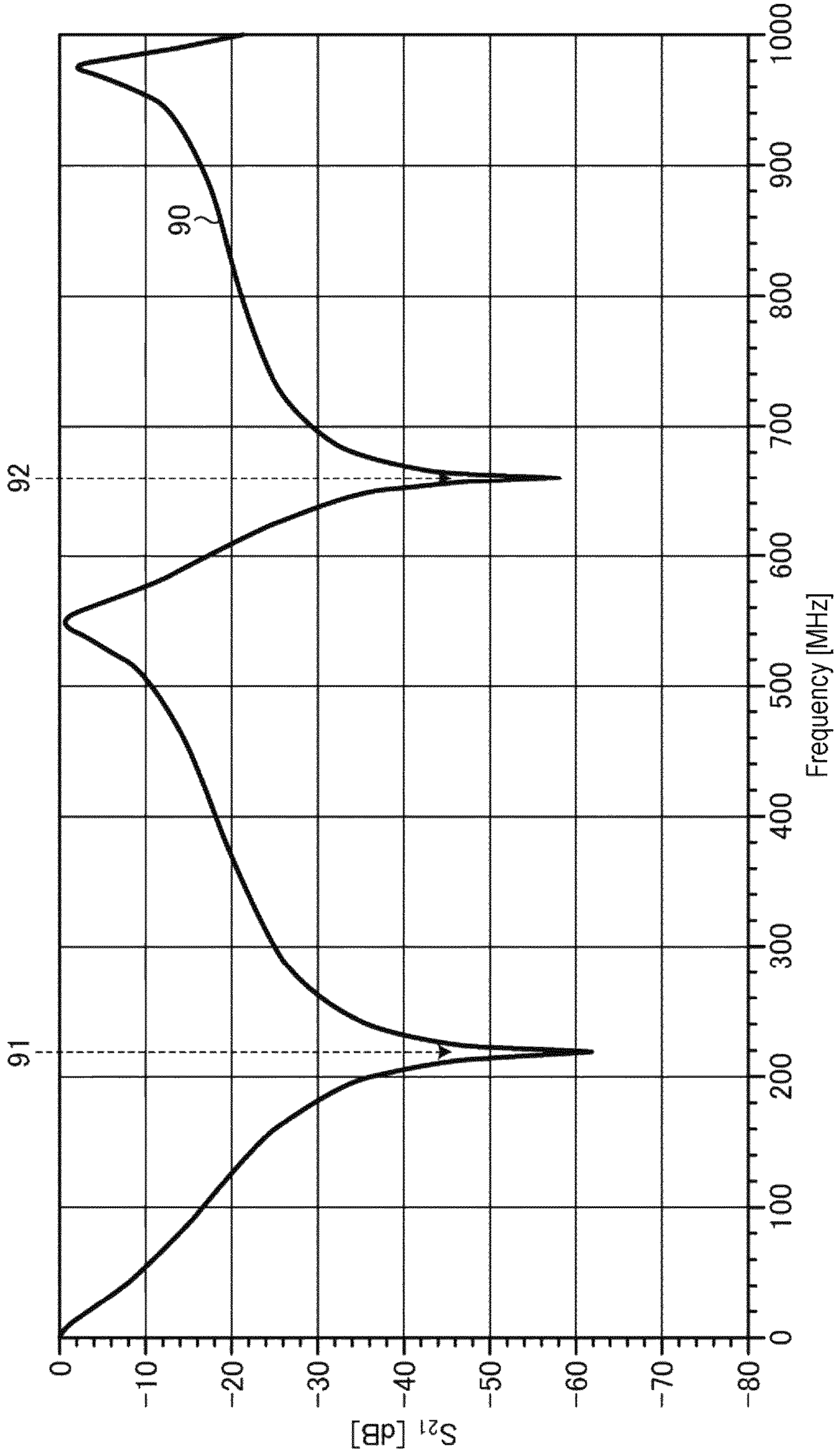
FIG. 8 is a graph showing an example of a frequency characteristic of the filter circuit according to the present embodiment.

FIG. 8 is a graph showing an example of a frequency characteristic of the filter circuit according to the present embodiment. A graph 90 shown in FIG. 8 represents the frequency characteristic of the filter circuit 50 by using an S-parameter $S_{21}$. In FIG. 8, since a vertical axis of the graph represents $S_{21}$ (insertion loss), an amount of attenuation increases as $S_{21}$ approaches a negative side. Also, in FIG. 8, a fundamental frequency (220 MHz) of the electromagnetic wave to be blocked is represented as a fundamental frequency 91 and a third harmonic (660 MHz) is represented as a third harmonic 92. As shown in the graph 90, the amount of attenuation of the filter circuit 50 is maximum at the fundamental frequency of 220 MHz and the insertion loss is −62 dB. The insertion loss in a range of 180 MHz to 260 MHz is below −30 dB. Additionally, the insertion loss of the filter circuit 50 is −58 dB at the third harmonic of 660 MHz. The insertion loss in a range of 640 MHz to 700 MHz is below −30 dB. In other words, the filter circuit 50 forms a band-stop filter centered on 220 MHz and 660 MHz. Thus, in the present embodiment, in a three-dimensional circuit in which the antenna portion 65 and the partition portion 70 are stacked in an internal space in which the dimension of the X direction from the antenna base 62 is larger than the dimension of the Y direction from the antenna base 62, radio-frequency resonance of the frequency to be blocked is performed. Thereby, a simple and compact radio-frequency filter for a high-output radio-frequency power such as 1000 W in a very high frequency (VHF) band may be achieved. In addition, since the power feed line 61 is insulated from the housing 51, an output of the DC power supply 45 may be applied to the electrostatic electrode 1111*b* without ground fault. Furthermore, in the present embodiment, in a frequency range in which the insertion loss is −30 dB or less, an electromagnetic wave (single-peak waveform) with a frequency varied by using FM modulation, etc. or an electromagnetic wave (broadband waveform) with a plurality of frequencies generated as multiple tones may be blocked. In addition, in the filter circuit 50, both the fundamental frequency (220 MHz) of the electromagnetic wave to be blocked and the third harmonic (660 MHz) may be simultaneously attenuated and blocked.

[Relationship Between Lengths of Housing in XY Directions and Filter Frequency]

Next, relationships between lengths in the XY directions of the housing and a filter frequency are described with reference to FIGS. 9 to 11. The length in the X direction and the length in the Y direction in FIGS. 9 to 11 correspond to the dimensions X and Y shown in FIG. 5, respectively. The dimension X is a length from a center of the antenna base 62 to an end of the second fin 67 near the side surface 60*a*, and the dimension Y is a length from a center line in the X direction passing through the input port 52 and the antenna base 62 to an end of the second fin 67 near the side surface 60*c*. The length in the X direction and the length in the Y direction may also take a center of the gap 72 shown in FIG. 5 (the center of the transmission path) as a reference for the ends of the second fin 67. The length in the X direction and the length in the Y direction may also be half the values of dimensions in the X direction and the Y direction of the housing 51 (lengths from the center of the antenna base 62 to the side surfaces 60*a* and 60*c*, respectively).

Figure 9:
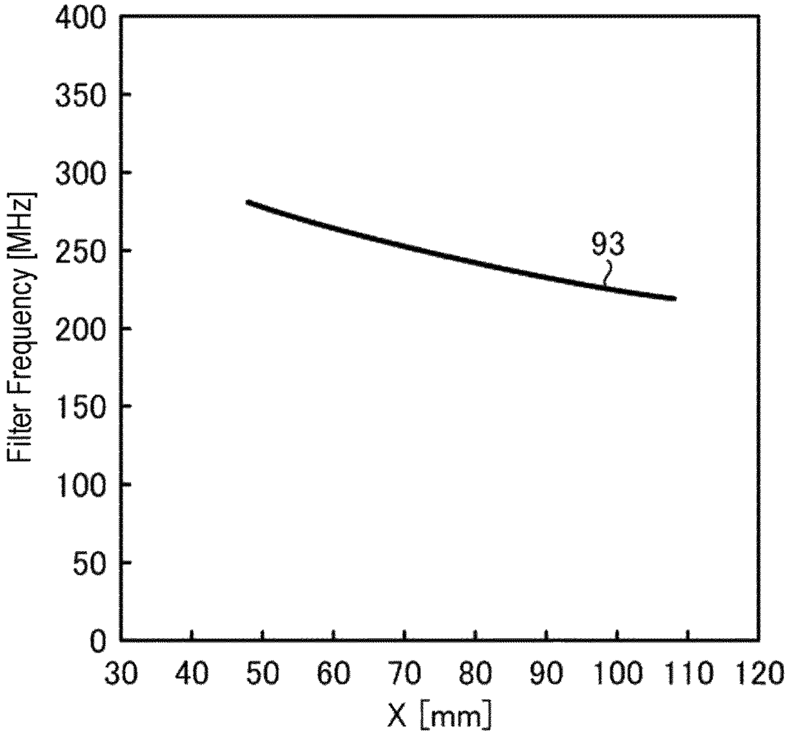
FIG. 9 is a graph showing an example of a relationship between a length in an X direction of a housing and a filter frequency.

FIG. 9 is a graph showing an example of a relationship between the length in the X direction of the housing and the filter frequency. A graph 93 shown in FIG. 9 illustrates the relationship with the filter frequency when the length in the Y direction (dimension Y) is set to 20 mm and the length in the X direction (dimension X) is changed. As shown in the graph 93, the filter frequency tends to decrease as the length in the X direction increases, from the filter frequency of 281 MHz at the dimension X of 48 mm to the filter frequency of 219 MHz at the dimension X of 108 mm.

Figure 10:
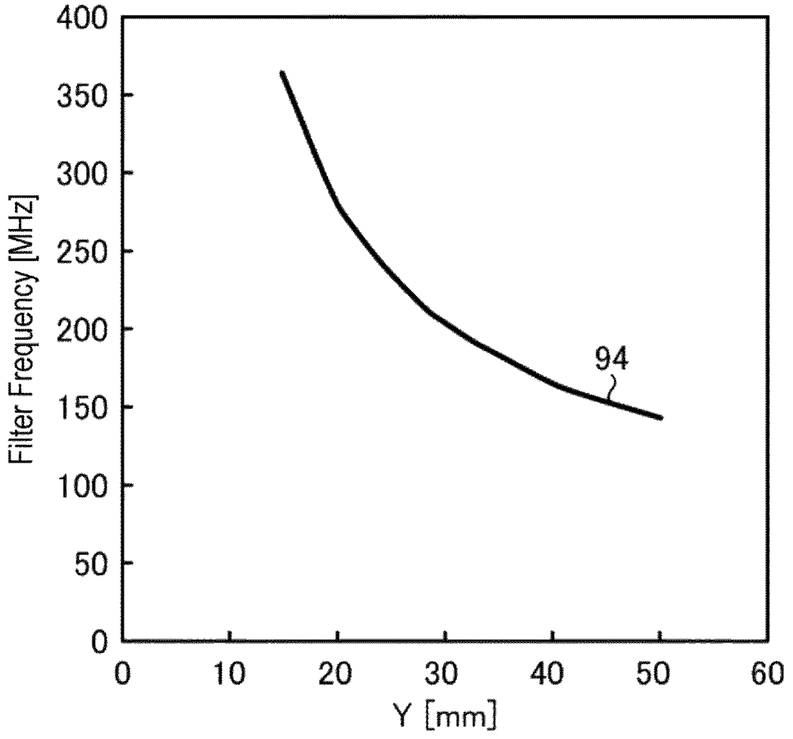
FIG. 10 is a graph showing an example of a relationship between a length in a Y direction of the housing and the filter frequency.

FIG. 10 is a graph showing an example of a relationship between the length in the Y direction of the housing and the filter frequency. A graph 94 shown in FIG. 10 illustrates the relationship with the filter frequency when the length in the X direction (dimension X) is set to 48 mm and the length in the Y direction (dimension Y) is changed. As shown in the graph 94, the filter frequency tends to decrease as the length in the Y direction increases, from the filter frequency of 363 MHz at the dimension Y of 15 mm to the filter frequency of 143 MHz at the dimension Y of 50 mm.

Now, generalizing the graphs 93 and 94 is considered. A wave number vector of a propagating electromagnetic wave in the filter circuit 50 is expressed as Equation (3) below. Based on Equation (3), a wave number k is defined as Equation (4). Therefore, an effective wavelength $\lambda_{eff}$ may be expressed as Equation (5). Furthermore, based on Equation (5), a characteristic parameter β is defined as Equation (6).

$$\vec{k} = \vec{k}_x \times \vec{k}_y \tag{3}$$

where $\vec{k}$ denotes a wave number vector of a propagating electromagnetic wave, $\vec{k}_x$ denotes a wave number vector in the X direction, and $\vec{k}_y$ denotes a wave number vector in the Y direction.

$$k = |\vec{k}| = \sqrt{k_x^2 + k_y^2} \tag{4}$$

$$\frac{1}{\lambda_{eff}} = \sqrt{\left(\frac{1}{\lambda_x}\right)^2 + \left(\frac{1}{\lambda_y}\right)^2} \tag{5}$$

$$\beta = \sqrt{\left(\frac{1}{X}\right)^2 + \left(\frac{1}{Y}\right)^2} \tag{6}$$

Herein, $\lambda_x$ is an effective wavelength in the X direction, and $\lambda_y$ is an effective wavelength in the Y direction. Additionally, X and Y correspond to the dimensions X and Y described above, respectively. That is, the dimension X is the length from the center of the antenna base 62 to the end of the second fin 67 near the side surface 60*a*, and the dimension Y is the length from the center line in the X direction passing through the input port 52 and the antenna base 62 to the end of the second fin 67 near the side surface 60*c*.

Figure 11:
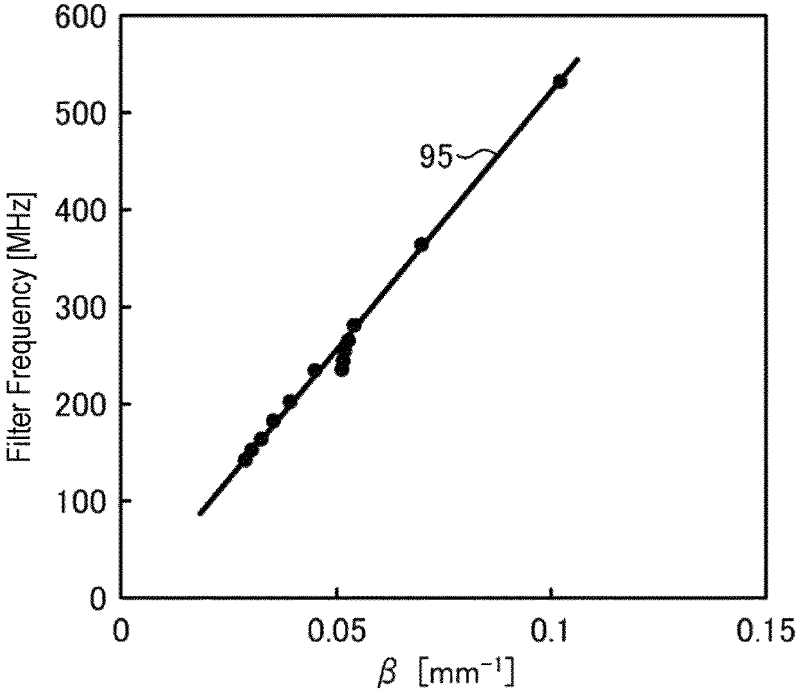
FIG. 11 is a graph showing an example of a relationship between the filter frequency and a characteristic parameter according to the present embodiment.

FIG. 11 shows an example of a relationship between the filter frequency and the characteristic parameter according to the present embodiment. As shown in a graph 95 in FIG. 11, there is a linear relationship between the filter frequency and the characteristic parameter β. Thus, in the present embodiment, dimensions of the second fin 67 in the XY directions may be determined based on the graph 95 according to a desired filter frequency. That is, the internal space of the housing 51 may have the dimension in the Y direction from the antenna base 62 and the dimension in the X direction from the antenna base 62 larger than the dimension in the Y direction from the antenna base 62. In other words, the filter frequency in the internal space is defined by Equation (6). That is, in the present embodiment, the dimensions (external dimensions) of the housing 51 in the XY directions may be determined according to a desired filter frequency based on the graph 95. In other words, the filter circuit 50 may reduce a dimension in a width direction (Y direction) when the filter circuit 50 is installed in a longitudinal direction (X direction) of the power feed line 61. Namely, the filter circuit 50 may have lengths of opposing sides (lengths of the side surface 60*a* or 60*b* in the Y direction) at one side of the housing 51 be shorter than the length of a ¼ wavelength at the filter frequency. A difference between the dimension of the second fin 67 and the dimension of the housing 51 is set to a range that is possible to be absorbed by the fine adjustment parameter α of Equation (1) described above. In this way, in the present embodiment, the filter frequency may be universally calculated by using the characteristic parameter β.

[Contact of Side Surfaces of Housing and Partition Portion]

Next, changes in filter characteristics in contact patterns between the side surfaces 60*a* to 60*d* of the housing 51 and the partition portion 70 are described with reference to FIG. 12. FIG. 12 is a diagram showing an example of the changes in the filter characteristics in the contact patterns between the side surfaces of the housing and the partition portion. In a table 96 shown in FIG. 12, an acceptable characteristic of the filter circuit 50 is represented as a circle (○) and an unacceptable characteristic of the filter circuit 50 is represented as a cross (×). Also, a vertical axis of the table 96 indicates the side surfaces 60*a* and 60*b* with which the partition portion 70 is in contact, and a horizontal axis of the table 96 indicates the side surfaces 60*c* and 60*d* with which the partition portion 70 is in contact. As shown in the table 96, if the partition portion 70 is not in contact with any one of the surfaces 60*c* and 60*d*, the filter frequency (resonance frequency) is misaligned and the third harmonic is not blocked, resulting in an unacceptable characteristic. On the other hand, if the partition portion 70 is in contact with both of the side surfaces 60*a* and 60*b* or if the partition portion 70 is in contact with any one of the side surfaces 60*a* and 60*b* and a gap δ between the other side surface of the side surfaces 60*a* and 60*b* and the side surface 60*a* or 60*b* is 2 mm or less, the characteristics are in acceptable states. That is, the condition for an acceptable characteristic is that the partition portion 70 is in contact with at least three side surfaces, except for any one of the side surfaces 60*a* and 60*b*, and the gap δ with a non-contact side surface 60*a* or 60*b* is 2 mm or less. Additionally, it is desirable that the partition portion 70 is in contact with the side surfaces 60*a* to 60*d* (in contact with the four side surfaces). Further, the partition portion 70 may have a gap (e.g., a mesh, a punching hole, etc.) of, for example, about λg/500 at contact portions with the side surfaces 60*a* to 60*d*. As an example, the gap may be formed at an edge portion in which the electric field intensity is low.

According to the present embodiment described above, the filter circuit 50 includes the housing 51, the partition portion 70, and the power feed line 61. The housing 51 is made of a conductor and includes the input port 52 and the output port 55 formed of the outer conductors 53 and 56 and the inner conductors 54 and 57, respectively. Further, the housing 51 is at ground potential together with the outer conductors 53 and 56 of the input port 52 and the output port 55 and is configured such that an internal space, in a plane view, has an area in the first direction (X direction) and in the second direction (Y direction) orthogonal to the first direction. The partition portion 70 is made of a conductor and is connected to the housing 51 to partition the internal space. The power feed line 61 is provided within the housing 51 and is insulated from the housing 51. In addition, the power feed line 61 is configured to include the input-side conductor, which is the inner conductor 54 of the input port 52, the output-side conductor, which is the inner conductor 57 of the output port 55, the antenna portion 65 which is connected to the input-side conductor and the output-side conductor and extends into the internal space so as to be stacked with the partition portion 70, and the antenna base 62 which connects the input-side conductor, the output-side conductor, and the antenna portion 65. The internal space has a dimension in the second direction from the antenna base 62 and a dimension in the first direction from the antenna base 62 larger than the dimension in the second direction from the antenna base 62. As a result, a simple and compact radio-frequency filter may be realized.

In addition, according to the present embodiment, the filter frequency in the internal space is defined by Equation (6) above. In Equation (6), β denotes the characteristic parameter, X denotes the dimension in the first direction, and Y denotes the dimension in the second direction. As a result, the dimensions (outer dimensions) of the housing 51 in the XY directions according to a desired filter frequency may be determined.

In addition, according to the present embodiment, the partition portion 70 is installed so as to have the predetermined gap 71 with respect to the antenna base 62. As a result, a transmission path may be formed between the partition portion 70 and the antenna portion 65.

In addition, according to the present embodiment, the antenna base 62 has a cylindrical shape. As a result, the predetermined gap 71 with respect to the antenna base 62 may be easily maintained. In addition, by making the gap 71 constant, phase misalignment (polarization) in the X direction and Y direction may be suppressed, thereby stabilizing the characteristics of the filter circuit 50.

Furthermore, according to this embodiment, the input port 52 and the output port 55 extend in the first direction that passes through the antenna base 62. The antenna base 62 extends in the third direction (Z direction) orthogonal to the first and second directions. The antenna portion 65 is provided to be widened in the first direction and the second direction from the antenna base 62. As a result, a simple and compact radio-frequency filter may be realized.

According to this embodiment, the partition portion 70 is in contact with the two side surfaces 60*c* and 60*d* intersecting with the second direction among the side surfaces 60*a* to 60*d* of the housing 51. As a result, the frequency characteristic of the filter circuit 50 may be improved.

Additionally, according to the present embodiment, the internal space has a rectangular parallelepiped shape. As a result, the antenna portion 65 and the partition portion 70 may be easily formed.

Additionally, according to the present embodiment, the partition portion 70 is in contact with the four side surfaces 60*a* to 60*d* of the housing 51. As a result, the frequency characteristic of the filter circuit 50 may be further improved.

Moreover, according to this embodiment, the filter circuit 50 is configured to provide the dielectric 68 with a higher relative permittivity than air between the partition portion 70 and the antenna portion 65. As a result, a more compact radio-frequency filter may be realized.

Furthermore, according to the present embodiment, spaces between the antenna portion and the housing 51 or the partition portion 70, from the end of the fin of the antenna portion 65 in the first direction, closest to the input port 52 and the output port 55 (first fin 66), to the center of the end 62*b* of the antenna base 62 to which the fin farthest from the input port 52 and the output port 55 (second fin 67*c*) is connected, form a choke structure based on a length of a ¼ wavelength of the electromagnetic wave to be blocked. As a result, the radio-frequency power may be blocked at the frequency to be blocked and the third harmonic.

It should be noted that the embodiments disclosed herein are exemplary in all aspects and are not restrictive. The above-described embodiments may be omitted, replaced, or modified in various forms without departing from the scope and spirit of the appended claims.

While, in the above-described embodiments, the transmission path length W1 is set to a ¼ wavelength of the electromagnetic wave to be blocked, the transmission path length W1 is not limited thereto. For example, the dimensions and the number of layers of the antenna portion 65 and the partition portion 70 may be set so that the travelling wave and the reflected wave have a transmission path length that cancels each other out.

In addition, while, in the above-described embodiments, the filter circuit 50 is connected to the electrostatic electrode 1111*b* inside the electrostatic chuck 1111, the configuration of the filter circuit 50 is not limited thereto. For example, the filter circuit 50 may be connected to a heater, which is not shown, provided inside the substrate support 11.

In addition, while, in the above-described embodiments, the plasma processing apparatus 1 that performs processing such as etching on the substrate W by using the capacitively coupled plasma as a plasma source has been described as an example, the disclosed technology is not limited thereto. If it is an apparatus that performs processing on the substrate W by using plasma, the plasma source is not limited to the capacitively coupled plasma, and any plasma source such as inductively coupled plasma, microwave plasma, or magnetron plasma may be used.

The present disclosure may take the following configuration.

(1) A filter circuit includes:

a housing made of a conductor and including an input port and an output port, each of the input port and the output port formed with an outer conductor and an inner conductor, wherein the housing is at ground potential together with the outer conductor of the input port and the outer conductor of the output port and is configured such that an internal space, in a plane view, has an area that extends in a first direction and in a second direction orthogonal to the first direction;

a partition portion made of a conductor and connected to the housing to partition the internal space; and a power feed line provided within the housing and insulated from the housing, wherein the power feed line includes:

an input-side conductor, which is the inner conductor of the input port;

an output-side conductor, which is the inner conductor of the output port;

an antenna portion connected to the input-side conductor and the output-side conductor and extending into the internal space so as to be stacked with the partition portion; and an antenna base configured to connect the input-side conductor, the output-side conductor, and the antenna portion, and wherein the internal space has a dimension in the second direction from the antenna base and a dimension in the first direction from the antenna base larger than the dimension in the second direction from the antenna base.

(2). In the filter circuit of (1), a filter frequency in the internal space is defined by Equation (A1) below:

$$\beta = \sqrt{\left(\frac{1}{X}\right)^2 + \left(\frac{1}{Y}\right)^2} \quad \text{(A1)}$$

where β denotes a characteristic parameter, X denotes the dimension in the first direction, and Y denotes the dimension in the second direction.

(3) In the filter circuit of (1) or (2), the partition portion is installed so as to have a predetermined gap with respect to the antenna base.

(4) In the filter circuit of any one of (1) to (3), the antenna base has a cylindrical shape.

(5). In the filter circuit of any one of (1) to (4), the input port and the output port extend in the first direction that passes through the antenna base, the antenna base extends in a third direction orthogonal to the first direction and the second direction, and the antenna portion is provided to be widened in the first direction and the second direction from the antenna base.

(6). In the filter circuit of (5), the partition portion is in contact with two side surfaces intersecting with the second direction among side surfaces of the housing.

(7). In the filter circuit of any one of (1) to (6), wherein the internal space has a rectangular parallelepiped shape.

(8). In the filter circuit of (7), the partition portion is in contact with four side surfaces of the housing.

(9). In the filter circuit of any one of (1) to (8), a dielectric with a higher relative permittivity than air is provided between the partition portion and the antenna portion.

(10). In the filter circuit of any one of (1) to (9), spaces between the antenna portion and the housing or the partition portion, from an end of a fin of the antenna portion in the first direction, closest to the input port and the output port, to a center of an end of the antenna base to which a fin farthest from the input port and the output port is connected, form a choke structure based on a length of a ¼ wavelength of an electromagnetic wave to be blocked.

(11). A plasma processing apparatus includes:

a processing container; and a filter circuit provided in a first power feed line for feeding power to an electrode exposed to an electromagnetic wave for generating plasma within the processing container, wherein the filter circuit includes:

a housing made of a conductor and including an input port and an output port, each of the input port and the output port formed with an outer conductor and an inner conductor, wherein the housing is at ground potential together with the outer conductor of the input port and the outer conductor of the output port and is configured such that an internal space, in a plane view, has an area that extends in a first direction and in a second direction orthogonal to the first direction;

a partition portion made of a conductor and connected to the housing to partition the internal space; and a second power feed line provided within the housing and insulated from the housing, wherein the second power feed line includes:

an input-side conductor, which is the inner conductor of the input port;

an output-side conductor, which is the inner conductor of the output port;

an antenna portion connected to the input-side conductor and the output-side conductor and extending into the internal space so as to be stacked with the partition portion; and an antenna base configured to connect the input-side conductor, the output-side conductor, and the antenna portion, and wherein the internal space has a dimension in the second direction from the antenna base and a dimension in the first direction from the antenna base larger than the dimension in the second direction from the antenna base.

According to the present disclosure, a simple and compact radio-frequency filter may be achieved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A filter circuit, comprising:

a housing made of a conductor and including an input port and an output port, each of the input port and the output port formed with an outer conductor and an inner conductor, wherein the housing is at ground potential together with the outer conductor of the input port and the outer conductor of the output port and is configured such that an internal space, in a plane view, has an area that extends in a first direction and in a second direction orthogonal to the first direction;

a partition portion made of a conductor and connected to the housing to partition the internal space; and a power feed line provided within the housing and insulated from the housing, wherein the power feed line includes:

an input-side conductor, which is the inner conductor of the input port;

an output-side conductor, which is the inner conductor of the output port;

an antenna portion connected to the input-side conductor and the output-side conductor and extending in the internal space so as to be stacked with the partition portion; and an antenna base configured to connect the input-side conductor, the output-side conductor, and the antenna portion, and wherein the internal space has a dimension in the second direction from the antenna base and a dimension in the first direction from the antenna base larger than the dimension in the second direction from the antenna base.

2. The filter circuit of claim 1, wherein a filter frequency in the internal space is defined by Equation (1) below:

$$\beta = \sqrt{\left(\frac{1}{X}\right)^2 + \left(\frac{1}{Y}\right)^2} \quad (1)$$

where β denotes a characteristic parameter, X denotes the dimension in the first direction, and Y denotes the dimension in the second direction.

3. The filter circuit of claim 2, wherein the partition portion is installed so as to have a predetermined gap with respect to the antenna base.

4. The filter circuit of claim 2, wherein the antenna base has a cylindrical shape.

5. The filter circuit of claim 2, wherein the input port and the output port extend in the first direction that passes through the antenna base, wherein the antenna base extends in a third direction orthogonal to the first direction and the second direction, and wherein the antenna portion is provided to be widened in the first direction and the second direction from the antenna base.

6. The filter circuit of claim 5, wherein the partition portion is in contact with two side surfaces intersecting with the second direction among side surfaces of the housing.

7. The filter circuit of claim 2, wherein the internal space has a rectangular parallelepiped shape.

8. The filter circuit of claim 7, wherein the partition portion is in contact with four side surfaces of the housing.

9. The filter circuit of claim 2, wherein a dielectric with a higher relative permittivity than air is provided between the partition portion and the antenna portion.

10. The filter circuit of claim 2, wherein spaces between the antenna portion and the housing or the partition portion, from an end of a fin of the antenna portion in the first direction, closest to the input port and the output port, to a center of an end of the antenna base to which a fin farthest from the input port and the output port is connected, form a choke structure based on a length of a ¼ wavelength of an electromagnetic wave to be blocked.

11. The filter circuit of claim 1, wherein the partition portion is installed so as to have a predetermined gap with respect to the antenna base.

12. The filter circuit of claim 1, wherein the antenna base has a cylindrical shape.

13. The filter circuit of claim 1, wherein the input port and the output port extend in the first direction that passes through the antenna base, wherein the antenna base extends in a third direction orthogonal to the first direction and the second direction, and wherein the antenna portion is provided to be widened in the first direction and the second direction from the antenna base.

14. The filter circuit of claim 1, wherein the internal space has a rectangular parallelepiped shape.

15. The filter circuit of claim 1, wherein a dielectric with a higher relative permittivity than air is provided between the partition portion and the antenna portion.

16. The filter circuit of claim 1, wherein spaces between the antenna portion and the housing or the partition portion, from an end of a fin of the antenna portion in the first direction, closest to the input port and the output port, to a center of an end of the antenna base to which a fin farthest from the input port and the output port is connected, form a choke structure based on a length of a ¼ wavelength of an electromagnetic wave to be blocked.

17. A plasma processing apparatus, comprising:

a processing container; and a filter circuit provided in a first power feed line for feeding power to an electrode exposed to an electromagnetic wave for generating plasma within the processing container, wherein the filter circuit includes:

a housing made of a conductor and including an input port and an output port, each of the input port and the output port formed with an outer conductor and an inner conductor, wherein the housing is at ground potential together with the outer conductor of the input port and the outer conductor of the output port and is configured such that an internal space, in a plane view, has an area that extends in a first direction and in a second direction orthogonal to the first direction;

a partition portion made of a conductor and connected to the housing to partition the internal space; and a second power feed line provided within the housing and insulated from the housing, wherein the second power feed line includes:

an input-side conductor, which is the inner conductor of the input port;

an output-side conductor, which is the inner conductor of the output port;

an antenna portion connected to the input-side conductor and the output-side conductor and extending into the internal space so as to be stacked with the partition portion; and an antenna base configured to connect the input-side conductor, the output-side conductor, and the antenna portion, and wherein the internal space has a dimension in the second direction from the antenna base and a dimension in the first direction from the antenna base larger than the dimension in the second direction from the antenna base.

* * * * *